United States Patent [19]

Shaik et al.

[11] Patent Number: 5,126,594

[45] Date of Patent: Jun. 30, 1992

[54] VOLTAGE SPIKE DETECTION CIRCUIT FOR USE IN DETECTING CLOCK EDGE TRANSITIONS WITHIN A SERIAL COMMUNICATION SYSTEM

[75] Inventors: Yehuda Shaik, Ramat-Gan; Yehuda Rudin, Netanya; Moti Kurnick, Tel-Aviv, all of Israel

[73] Assignee: Motorola, Inc., Schaumbert, Ill.

[21] Appl. No.: 731,608

[22] Filed: Jul. 17, 1991

[51] Int. Cl.⁵ .......................................... H03K 19/00
[52] U.S. Cl. .................................. 307/443; 307/480
[58] Field of Search .............. 307/260, 269, 440, 443, 307/480; 328/110; 375/58, 60

[56] References Cited

U.S. PATENT DOCUMENTS

| | | | |
|---|---|---|---|
| 4,614,973 | 9/1986 | Sorenson | 307/269 |
| 4,691,124 | 9/1987 | Ledzius et al. | 307/269 |
| 4,864,160 | 9/1989 | Abdoo | 307/269 |
| 4,929,854 | 5/1990 | Iino et al. | 307/269 |
| 5,036,221 | 7/1991 | Brucculeri et al. | 307/443 |

Primary Examiner—Robert J. Pascal
Attorney, Agent, or Firm—Robert L. King

[57] ABSTRACT

A voltage spike detection circuit for use in detecting clock edge transitions utilizes a voltage change detection circuit (16) and a voltage spike latching circuit (18). The voltage change detection circuit (16) provides an output pulse in response to each edge transition of a serial communication clock, including an edge caused by a noise spike on the serial communication clock. In response to receiving the output pulse of the voltage change detection circuit (16), the voltage spike latching circuit (18) provides an active system interrupt signal to a serial communication system. When the serial communication system receives the active system interrupt signal, the serial communication system momentarily activates a system reset signal and re-communicates the serial communication data.

10 Claims, 3 Drawing Sheets

VOLTAGE SPIKE DETECTION CIRCUIT FOR USE IN DETECTING CLOCK EDGE TRANSITIONS WITHIN A SERIAL COMMUNICATION SYSTEM

FIELD OF THE INVENTION

This invention relates generally to serial communication systems, and more particularly, to detecting voltage spikes within a serial communication clock for a serial communication system.

BACKGROUND OF THE INVENTION

A serial communication system communicates data in reference to a serial communication clock. A plurality of state machines are generally required to support a communication protocol within the serial communication system. To maintain proper sequencing of state machines within the serial communication system which are dependent on the accuracy of the serial communication clock, the serial communication clock is required to be free of extraneous voltage spikes. When an extraneous voltage spike is detected on the serial communication clock during a data transmission, the serial communication system is interrupted and data transmission is repeated.

A known method of detecting extraneous voltage spikes on a serial communication clock involves the use of a circuit known as a voter circuit. The voter circuit will generally have a plurality of connected latches with an output of each latch being connected to a voting logic gate circuit. An input of the voter circuit couples the serial communication clock at a predetermined frequency. The predetermined frequency is generally substantially greater than the serial communication clock. The voting logic gate circuit then determines if the data within the serially connected latches is correct at predetermined time intervals. Problems with the voter circuit include, but are not limited to: a substantial amount of logic required for implementation, the voter circuit is required to operate at higher frequency rates, and a predetermined amount of critical time delay of the serial communication clock exists. The predetermined amount of time delay of the serial communication clock requires that the serially transmitted data also be delayed.

Another approach to assuring the integrity of data communication when an extraneous voltage spike occurs on a serial communication clock is through the use of an analog filter. The analog filter is coupled in series between the serial communication clock and the serial communication system. The analog filter allows only the serial communication clock signal to pass and filters out all other signals. A problem with the analog filter approach is that it is not readily adaptable to a general purpose communication system having a range of operating frequencies for the serial communication clock.

It is therefore desired to maintain proper sequencing of state machines within the serial communication system which are dependent on the integrity of the serial communication clock which operates over a range of frequencies. It is further desired that only a minimum of additional logic circuitry be required to guarantee the system integrity without time delay.

SUMMARY OF THE INVENTION

The previously mentioned needs are fulfilled with the present invention. In one form, a voltage spike detection circuit is used to detect clock edge transitions within a serial communication system. A voltage change detection circuit has an input coupled to a serial communication clock of the serial communication system, and an output. The voltage change detection circuit detects clock edge transitions of the serial communication clock. A first plurality of series-coupled latch circuits has a first input coupled to the output of the voltage change detection circuit, a second input for receiving a first reference clock, a third input coupled to an inversion of the first reference clock, and an output. A second plurality of series-coupled latch circuits has a first input coupled to the output of the voltage change detection circuit, a second input for receiving a second reference clock, a third input coupled to an inversion of the second reference clock, and an output. An output means is coupled to the output of the first and second pluralities of series-coupled latch circuits. The output means detects if the output of either the first or the second plurality of series-coupled latch circuits is active. The output means stores and provides a predetermined logic state as an interrupt signal to the serial communication system in response to the detecting.

These and other features, and advantages, will be more clearly understood from the following detailed description taken in conjunction with the accompanying drawings.

DESCRIPTION OF A PREFERRED EMBODIMENT

Figure 1:
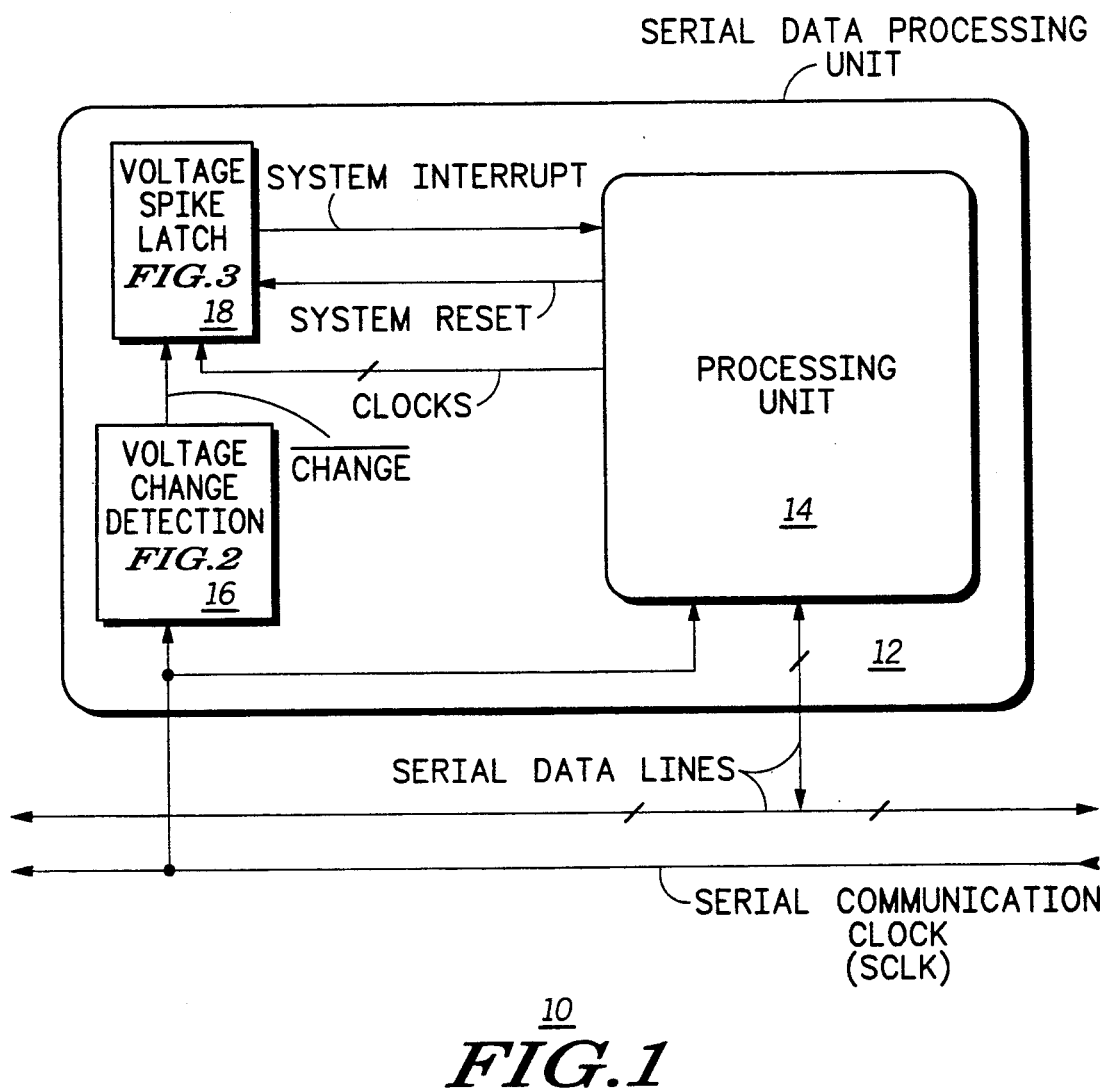
FIG. 1 illustrates in block diagram form a serial communication system having a voltage spike detection circuit in accordance with the present invention.

Illustrated in FIG. 1 is a serial communication system 10. Serial communication system 10 has a serial data processing unit 12, serial data lines, and a serial communication clock signal labeled "SCLK." The serial data processing unit 12 has a processing unit 14, a voltage change detection circuit 16, and a voltage spike latching circuit 18. The processing unit 14 has an input/output (I/O) connected to the serial data lines for communicating data, a clock input connected to the SCLK clock signal, and an input connected to the voltage spike latching circuit 18 via a signal labeled "system interrupt". The processing unit 14 has a clock output connected to a clock input of the voltage spike latching circuit 18 via a bus labeled "clocks," and an output connected to an input of the voltage spike latching circuit 18 via a signal labeled "system reset." The voltage spike latching circuit 18 has an input connected to an output of the voltage change detection circuit 16 to receive a signal labeled "change." The voltage change detection circuit 16 has an input connected to the SCLK clock signal.

Figure 2:
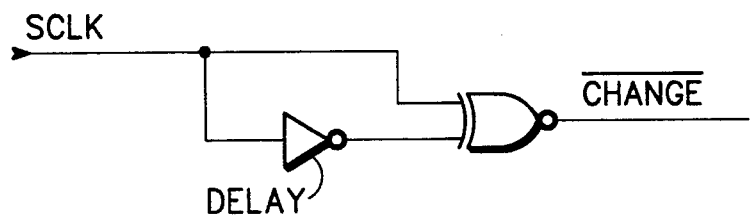
FIG. 2 illustrates in logic diagram form the voltage change detection circuit of FIG. 1.

FIG. 2 illustrates the voltage change detection circuit 16. In the illustrated form, voltage change detection circuit 16 utilizes an exclusive-NOR gate and an inverter labeled "delay." The voltage change detection circuit 16 operates as a one-shot circuit. That is, each time the input clock signal SCLK transitions from a logic one to a logic zero or a logic zero to a logic one, the output signal change is activated for a predetermined period of time. The predetermined period of activated output time is approximately equal to the signal delay time through the inverter. Therefore, the active pulse width time of the change signal is easily programmable by utilizing any odd number of inverters to preserve the inversion function.

Figure 3:
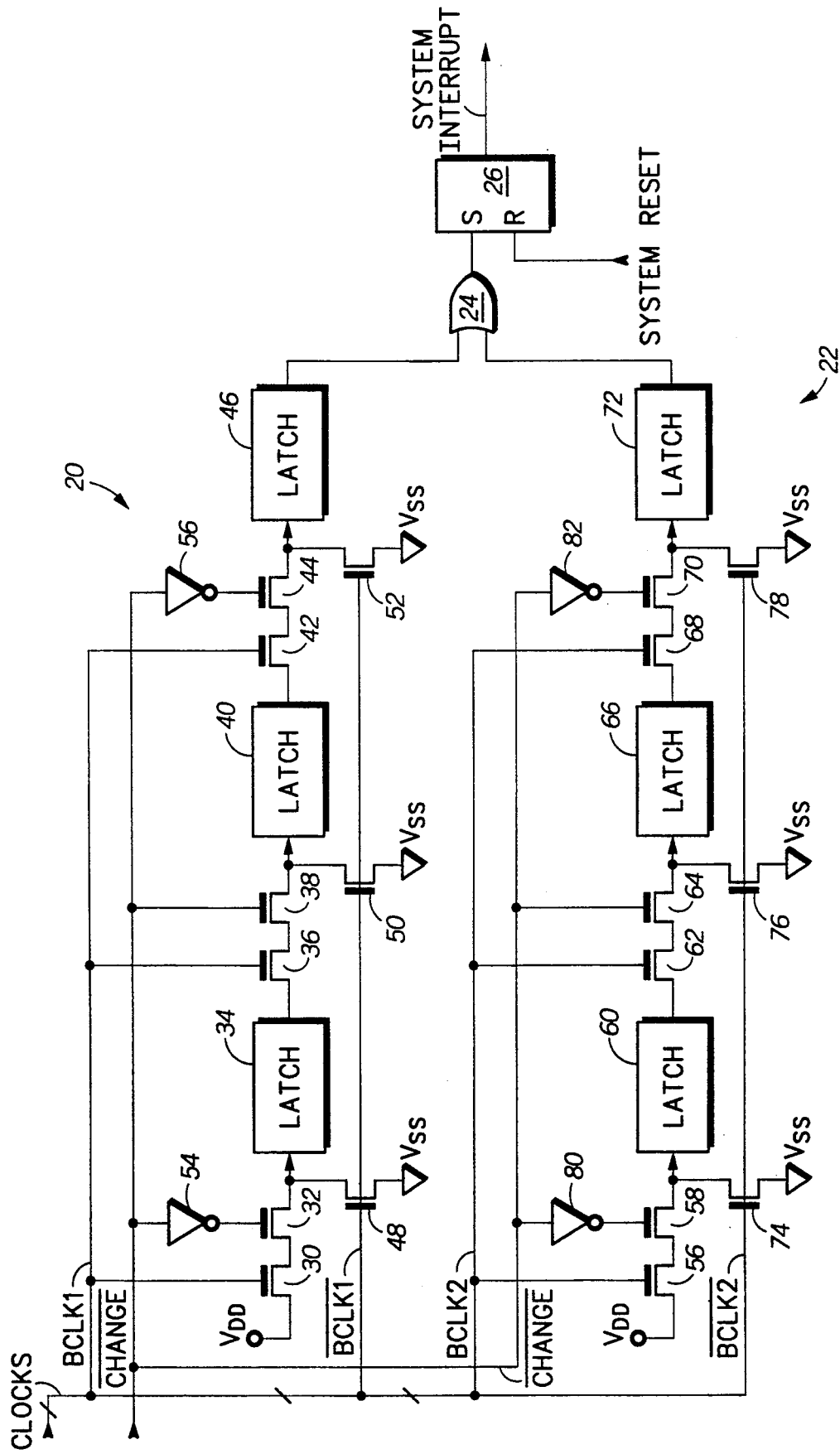
FIG. 3 illustrates in partial logic diagram form the voltage spike latching circuit of FIG. 1.

FIG. 3 illustrates the voltage spike latching circuit 18. The voltage spike latching circuit 18 has a first group of serially connected latches portion 20, a second group of serially connected latches portion 22, a logic OR gate 24, and a set/reset latch (S/R latch) 26. The first group of serially connected latches portion 20 has a latch 34 with an input coupled to a power supply $V_{DD}$ through series connected transistor switches 30 and 32, a latch 40 with an input coupled to an output of latch 34 through series connected transistor switches 36 and 38, and a latch 46 having an input coupled to an output of latch 40 through series connected transistor switches 42 and 44. An output of latch 46 is connected to an input of OR gate 24. The first group of serially connected latches portion 20 has pull-down transistor switches 48, 50, and 52 connected to a power supply voltage labeled $V_{SS}$ and which are respectively connected to the input of latches 34, 40, and 46. A control electrode of transistor switches 30, 36, and 42 are each connected to a signal labeled "BCLK1." A control electrode of transistor switches 32 and 44 is respectively connected to an output of inverters 54 and 56. An input to inverters 54 and 56 is connected to change. A control electrode of transistor switch 38 is also connected to change. A control electrode of transistor switches 48, 50, and 52 are each connected to a signal labeled "BLCK1." The serially connected latch portion 22 has a latch 60 with an input coupled to $V_{DD}$ through series connected transistor switches 56 and 58, a latch 66 with an input coupled to an output of latch 60 through series connected transistor switches 62 and 64, and a latch 72 having an input connected to an output of latch 66 through series connected transistor switches 68 and 70. An output of latch 72 is coupled to an input of OR gate 24. The second group of serially connected latches portion 22 has pulldown transistor switches 74, 76, and 78 which are respectively connected to the input of latches 60, 66, and 72. A control electrode of transistor switches 56, 62, and 68 is each connected to a signal labeled "BCLK2." A control electrode of transistor switches 58 and 70 is respectively coupled to an output of an inverter 80 and an inverter 82. An input to inverters 80 and 82 is connected to change. A control electrode of switch 64 is also connected to the change signal. A control electrode of each transistor switch of switches 74, 76, and 78 is connected to a signal labeled "BLCK2." OR gate 24 has an output connected to an input of the S/R latch 26 labeled "S." The S/R latch 26 has a reset input labeled "R" to receive the signal labeled "System Reset." An output of the S/R latch 26 is the system interrupt signal of FIG. 1.

Figure 4:
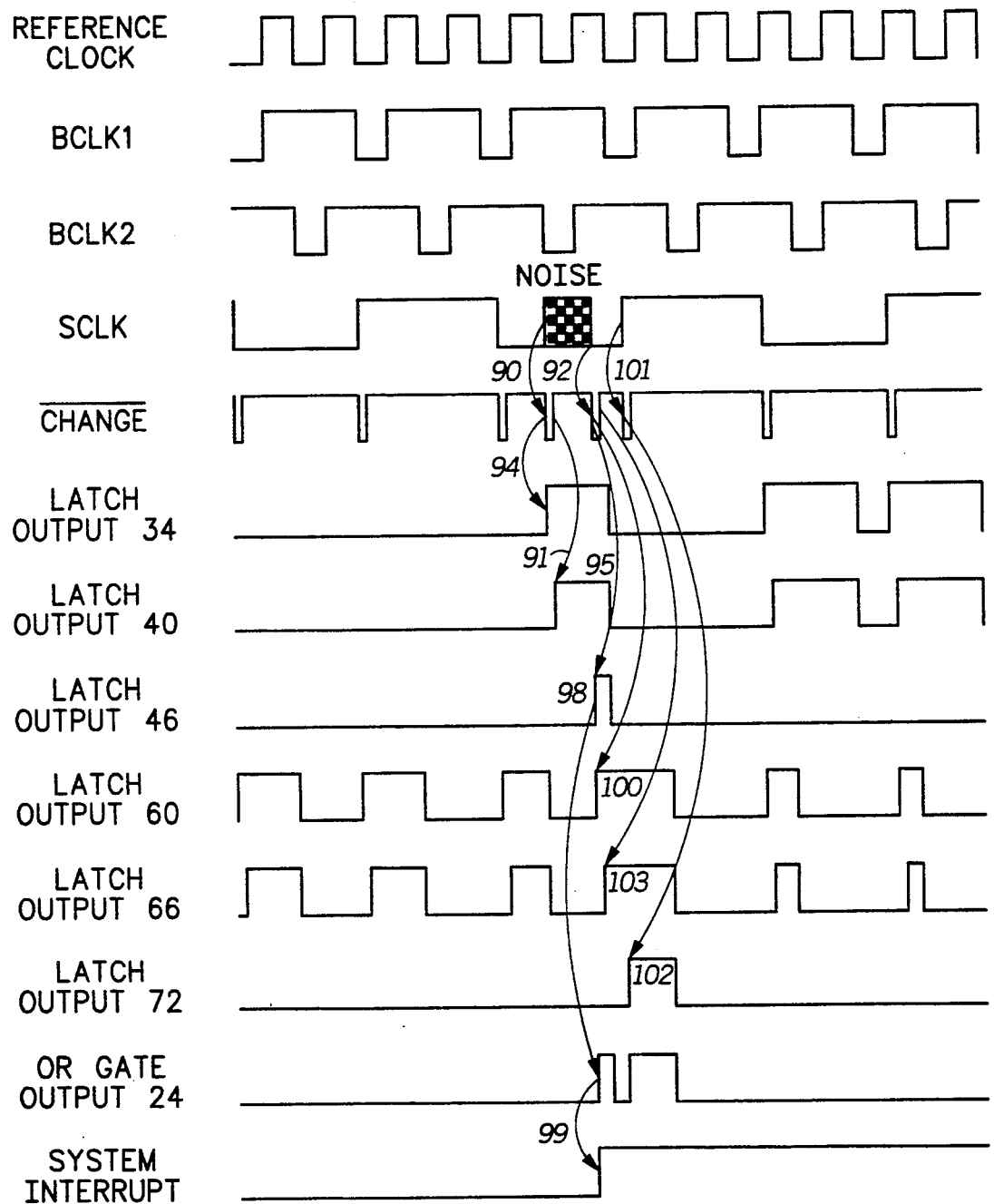
FIG. 4 illustrates in timing diagram form timing wave-forms to illustrate the present invention.

In operation, the voltage change detection circuit 16 of FIGS. 1 and 2 receives the SCLK signal. In response to each rising and falling edge of the SCLK, the change detection circuit 16 produces a voltage pulse output. FIG. 4 illustrates the output of the change detection circuit 16, change, responding to each voltage transition of the SCLK signal. The voltage spike latching circuit 18 of FIGS. 1 and 3 receives the change signal. The voltage spike latching circuit 18 latches the change signal with the aid of reference clocks. If a noise pulse is detected on the SCLK signal, a predetermined one or both of the outputs of the serial connected latch portions 20 and 22 are activated. In response to receiving an active output from the serial connected latch portions 20 or 22, the output of OR gate 24 is activated. When the output of OR gate 24 is activated, the output of S/R latch 26, the system interrupt signal, is activated. The activated system interrupt signal, which is received by processing unit 14 of FIG. 1, causes processing unit 14 to activate the system reset signal. At a predetermined time later the system reset signal is activated, serial data communication via the serial data lines is repeated for the time period in which the noise pulse was detected on the SCLK signal. Further, the system interrupt signal remains activated until the system reset signal clears S/R latch 26 with an active system reset signal.

In more detail, a reference clock illustrated in FIG. 4 and labeled "reference clock" is utilized to generate the BCLK1 and BCLK2 clock signals. In the preferred embodiment, the BCLK1 and BCLK2 signals each have a duty cycle of 75%-25%. The 75%-25% duty cycle clocks are overlapping clocks to detect an extraneous noise spike at any time on the SCLK clock. The SCLK clock signal is typically provided by an external source and is generally asynchronous to the reference clock. The reference clock frequency is determined according to an expected worst case duty cycle variance of the highest frequency of the SCLK clock signal such that a maximum of one clock edge of the SCLK clock signal will occur during an active sample period of BCLK1 and BCLK2 clock signals. FIG. 4 illustrates a typical timing relationship between the BCLK1, BCLK2, and SCLK clock signals. FIG. 4 additionally illustrates a skew in time between the BCLK1 and BCLK2 clock signals which are generated from the reference clock. Further, the timing relationship between the SCLK, and the BCLK1 and BCLK2 clock signals allows a noise pulse on the SCLK clock signal to be detected by the voltage spike latching circuit 18 independent of where the pulse occurs in time. Also, the overlapping timing relationship of the BCLK1 and BCLK2 clock signals ensures that each noise spike on the SCLK clock signal, whose pulse width is shorter than one phase of the reference clock, is detected. As mentioned earlier, each edge of the SCLK clock signal causes the voltage change detector 16 to produce an active change signal. When change is active low and the BCLK1 signal is active high, $V_{DD}$ is coupled to the input of latch 34 and latched at the output of latch 34. The output of latch 34 remains at a latched logic one value until the BCLK1 clock signal transitions low which causes the BCLK1 clock signal to transition high. When the BCLK1 clock signal transitions high, transistor switches 48, 50, and 52 are each activated which causes latches 34, 40, and 46 to be cleared or reset. If a noise pulse is present on the SCLK clock signal, as indicated in the timing diagram of FIG. 4, additional change signal output pulses are generated which in turn cause a system reset. For example, a rising edge of the noise pulse on the SCLK clock signal illustrated in FIG. 4 causes an active output of the change signal as illustrated with arrow 90. Further, arrow 94 demonstrates the active change signal causing latch 34 to have an activated output. A falling edge of the noise pulse causes an additional pulse in the complementary change signal as indicated with arrow 92. Since the time period between arrows 90 and 92, which also represents the pulse width of the noise pulse, is during a time period in which the BCLK1 clock signal is still active, the active output of latch 34 is coupled to latch 40 via activated transistor switches 36 and 38 upon a rising edge of the change signal. Arrow 91 illustrates latch 40 being activated upon the rising edge of change. As indicated with arrow 92, when the falling edge of the noise pulse causes the change signal to pulse low while the BCLK1 clock signal is still active, the active output of latch 40 is coupled via transistor switches 42 and 44 to latch 46. Arrow 95 illustrates latch 46 being activated in response to the falling edge of change. Arrow 98 demonstrates the active output of latch 46 causing OR gate 24 to produce an active output. In response to the active output of OR gate 24, the output of S/R latch 26, system interrupt, is activated as illustrated with arrow 99.

The second group of serially connected latches portion 22, which is clocked by the BCLK2 and BCLK2 clock signals, operates in a similar manner to the first group of serially connected latches portion 20. FIG. 4 illustrates the output of latch 60 being activated at the clock edge indicated by arrow 100 in response to a first active change signal and while BCLK2 is active. This first active change signal is the result of the falling edge of the noise pulse and is illustrated with arrow 92. Arrow 103 illustrates that in response to a rising edge of the change signal, the active logic state within latch 60 is transferred to latch 66 via switches transistor 62 and 64. When the rising edge of the SCLK clock signal occurs while the BCLK2 clock signal is still active and generates a second change signal, as indicated with arrow 101, latch 72 receives the active output of latch 66 via activated transistor switches 68 and 70. Arrow 102 illustrates latch 72 being activated. In response to latch 72 being activated, the output of OR gate 24 is activated. For this example, since S/R latch 26 was previously activated in response to latch 46 being activated, S/R latch 26 is not affected by the activation of OR gate 24 due to an active output of latch 72.

To summarize, a voltage change detection circuit 16 has an input connected to a serial communication clock, SCLK, and an output to indicate each clock edge transition of the SCLK clock signal. The pulse width output of change detection circuit 16, change, is adjustable with the delay provided by an inverter. The output of the voltage detection circuit 16 is connected to an input of a voltage spike latching circuit 18. The voltage spike latching circuit 18 has a first and second plurality of series-coupled latches portions 20 and 22, respectively. The first and second plurality of series-coupled latch portions 20 and 22 are respectively clocked by a BCLK1 signal and a BCLK2 signal and the respective complements. BCLK1 and BCLK2 are derivatives of a reference clock, whereas the SCLK is an external clock which is typically asynchronous to the reference clock. The BCLK1 and BCLK2 signals provide overlapping coverage of the SCLK signal. The overlapping coverage allows a noise spike on the SCLK to be detected by the voltage spike latching circuit 18. In response to detecting a noise spike, the voltage spike latching circuit 18 activates a system interrupt signal to a processing unit 14 within a serial data processing unit 12. When the processing unit 14 receives the active system interrupt signal, processing unit 14 temporarily activates a system reset signal. After the system reset signal is deactivated, processing unit 14 re-communicates serial communication data that was being communicated during the SCLK time period in which the noise spike was detected. The voltage change detection circuit 16 along with the voltage spike latching circuit 18 utilizes a minimum number of logic gates for implementation and yet provides a reliable method for detecting and quickly responding to an interfering noise spike on a serial communication clock.

It should be well understood that various other one-shot circuits may be utilized as voltage change detection circuit 16, as well as one-shot circuits with an active output pulse. Although a voltage spike latching circuit 18 is illustrated utilizing series-coupled switches and latches, other combinations of data storage elements and logic circuits may be implemented. The discussed inventive principal of detecting noise on a clock for use within a serial communication system may be extended to detecting noise on other clock signals including those on a printed circuit board. For example, critical timing signals generated on a printed circuit board for operating or testing a data communication system would be benefited by monitoring the critical timing signals for noise spikes.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A voltage spike detection circuit for use in detecting clock edge transitions within a serial communication system comprising:
   a voltage change detection circuit having an input coupled to a serial communication clock of the serial communication system, and an output, the voltage change detection circuit detecting clock edge transitions of the serial communication clock;
   a first plurality of series-coupled latch circuits, said first plurality of series-coupled latch circuits having a first input coupled to the output of the voltage change detection circuit, a second input for receiving a first reference clock, a third input coupled to an inversion of the first reference clock, and an output;
   a second plurality of series-coupled latch circuits, said second plurality of series-coupled latch circuits having a first input coupled to the output of the voltage change detection circuit, a second input for receiving a second reference clock, a third input coupled to an inversion of the second reference clock, and an output;
   a logic gate having a first and a second input respectively coupled to the output of the first and second pluralities of series-coupled latch circuits, the logic gate having an output for indicating detecting if the output of either the first or the second plurality of series-coupled latch circuits is active; and
   storage means having an input coupled to the output of the logic gate, the storage means latching a predetermined logic state of the logic gate and having an output for providing an interrupt signal to the serial communication system.

2. The voltage spike detection circuit of claim 1 wherein said storage means further comprises a set/reset latch having a reset input coupled to a reset signal provided by the serial communication system, the reset signal forcing the output of the storage means to a first predetermined logic state. and having a set input coupled to the output of the logic gate, the output of logic gate forcing the output of the storage means to a second predetermined logic state.

3. The voltage spike detection circuit of claim 1 wherein the voltage change detection circuit further comprises:
   a second logic gate having a first input coupled to the serial communication clock, a second input, and an output for providing an edge detect signal;
   an odd number of logic state inverting circuits, including a single logic state inverting circuit, coupled between the serial communication clock and the second input of the second logic gate for providing a delayed inversion of the serial communication clock to the second input, the edge detect signal having a pulse width which is determined by the odd number and a gate delay associated with the second logic gate.

4. The voltage spike detection circuit of claim 1 wherein the first logic gate of the voltage change detection circuit performs a logical OR function.

5. The voltage spike detection circuit of claim 1 wherein the second logic gate of the voltage change detection circuit performs an exclusive NOR logical function.

6. The voltage spike detection circuit of claim 1 wherein each latch circuit of the first and second pluralities of series-coupled latch circuits is interconnected by first and second series-connected transistors, the first transistor having a control electrode connected to either the first or the second reference clock, the second transistor having a control electrode connected to a predetermined logic state of the output of the voltage change detection circuit, and a third transistor connected to the second transistor for selectively connecting a latch input of a predetermined latch circuit to a first power supply voltage terminal, the latch input of a first latch circuit of each of the first and second pluralities of latch circuits being connected by the first and second series-connected transistors to a second power supply voltage terminal.

7. A voltage spike detection circuit for use in detecting clock edge transitions within a serial communication system comprising:
   a voltage change detection circuit having an input coupled to a serial communication clock of the serial communication system, and an output, the voltage change detection circuit providing an output which transitions in logic state in response to detecting an edge transition of the serial communication clock;
   a first plurality of series-coupled latch circuits, said first plurality of series-coupled latch circuits having a first input coupled to the output of the voltage change detection circuit, a second input for receiving a first reference clock, a third input coupled to an inversion of the first reference clock, and selectively provides an active output indicating detection of a voltage spike on the serial communication clock;
   a second plurality of series-coupled latch circuits, said second plurality of series-coupled latch circuits having a first input coupled to the output of the voltage change detection circuit, a second input for receiving a second reference clock, a third input coupled to an inversion of the second reference clock, and selectively provides an active output also indicating detection of a voltage spike on the serial communication clock; and
   output means coupled to the output of the first and second pluralities of series-coupled latch circuits, said output means detecting if the output of either the first or the second plurality of series-coupled latch circuits is active, the output means storing and providing a predetermined logic state as an interrupt signal to the serial communication system in response to the detecting.

8. The voltage spike detection circuit of claim 7 wherein the voltage change detection circuit further comprises:
   a logic gate having a first input coupled to the serial communication clock, a second input, and an output for providing an edge detect signal; and
   an odd number of logic state inverting circuits, including a single logic state inverting circuit, coupled between the serial communication clock and the second input of the logic gate for providing a delayed inversion of the serial communication clock to the second input, the edge detect signal having a pulse width which is determined by the odd number and a gate delay associated with the second logic gate.

9. A method of interrupting a serial communication system in response to detecting clock edge transistions associated with voltage spikes, comprising the steps of:
   detecting clock edge transitions of the serial communication clock and providing a detect signal in response thereto;
   providing a first plurality of series-coupled latch circuits, a first of the latch circuits of the first plurality having an input selectively coupled to a power supply voltage terminal having a predetermined logic state;
   providing a second plurality of series-coupled latch circuits, a first of the latch circuits of the second plurality having an input selectively coupled to the power supply voltage terminal having the predetermined logic state;
   setting and resetting each latch circuit of the first plurality of latch circuits in response to both a first reference signal and the detect signal to provide a first control signal;
   setting and resetting each latch circuit of the second plurality of latch circuit in response to both a second reference signal and the detect signal to provide a second control signal; and
   detecting if either the first or the second control signals is active, and storing and providing an interrupt signal to the serial communication system in response to the detecting.

10. The method of claim 9 wherein the step of detecting clock edge transitions of the serial communication clock further comprises the steps of:
   coupling the serial communication clock to a first input of circuitry which implements a logical exclusive NOR function; and
   delaying coupling the serial communication clock to a second input of the circuitry to provide a delayed inversion of the serial communication clock to the second input, the detect signal having a pulse width which is determined by an amount of time associated with the delayed coupling and by a gate delay associated with the circuitry which implements the logical exclusive NOR function.

* * * * *